United States Patent
Liao et al.

(10) Patent No.: US 10,438,868 B2
(45) Date of Patent: Oct. 8, 2019

(54) AIR-COOLING HEAT DISSIPATION DEVICE

(71) Applicant: Microjet Technology Co., Ltd., Hsinchu (TW)

(72) Inventors: Jia-Yu Liao, Hsinchu (TW); Shih-Chang Chen, Hsinchu (TW); Che-Wei Huang, Hsinchu (TW); Chi-Feng Huang, Hsinchu (TW); Yung-Lung Han, Hsinchu (TW)

(73) Assignee: MICROJET TECHNOLOGY CO., LTD., Hsinchu (TW)

( * ) Notice: Subject to any disclaimer, the term of this patent is extended or adjusted under 35 U.S.C. 154(b) by 0 days.

(21) Appl. No.: 15/894,256

(22) Filed: Feb. 12, 2018

(65) Prior Publication Data
US 2018/0240734 A1 Aug. 23, 2018

Related U.S. Application Data

(63) Continuation-in-part of application No. 15/821,075, filed on Nov. 22, 2017.

(30) Foreign Application Priority Data
Feb. 20, 2017 (TW) .............................. 106105649 A (51) Int. Cl.
*H01L 23/467* (2006.01)
*H01L 23/367* (2006.01)
(Continued)

(52) U.S. Cl.
CPC ............ *H01L 23/467* (2013.01); *H01L 23/36* (2013.01); *H01L 23/3672* (2013.01); *H01L 23/4093* (2013.01); *H01L 2224/16* (2013.01)

(58) Field of Classification Search
CPC .............. H01L 23/467; H05K 7/20836; H05K 7/20254; H05K 7/20272; H05K 7/20327;
(Continued)

(56) References Cited

U.S. PATENT DOCUMENTS 5,834,864 A * 11/1998 Hesterman ............. B82Y 35/00
310/40 MM
7,553,135 B2 * 6/2009 Cho ...................... F04B 43/046
361/688
(Continued)

FOREIGN PATENT DOCUMENTS

CN 100568497 C 12/2009
CN 205383064 U 7/2016
(Continued)

OTHER PUBLICATIONS

English Translation CN 100568497C (Year: 2019).*
(Continued)

*Primary Examiner* — David M Sinclair
*Assistant Examiner* — Robert D Brown
(74) *Attorney, Agent, or Firm* — Birch, Stewart, Kolasch & Birch, LLP (57) ABSTRACT

An air-cooling heat dissipation device is provided for removing heat from an electronic component. The air-cooling heat dissipation device includes a supporting substrate, an air pump and a heat sink. The supporting substrate includes a top surface, a bottom surface, an introduction opening and a thermal conduction plate. The thermal conduction plate is located over the top surface of the supporting substrate and aligned with the introduction opening. The electronic component is disposed on the thermal conduction plate. The air pump is fixed on the bottom surface of the supporting substrate and aligned with the introduction opening. The heat sink is attached on the electronic component. When the air pump is enabled, an ambient air is introduced into the introduction opening to remove the heat from the thermal conduction plate.

12 Claims, 11 Drawing Sheets

(51) Int. Cl.
*H01L 23/40* (2006.01)
*H01L 23/36* (2006.01)

(58) Field of Classification Search
CPC ............ H05K 7/20409; H05K 7/20772; F28F 2215/04; F28F 27/00; F28F 3/04; G06F 1/206; G06F 2200/201; B60H 2001/003; F21V 29/83; F21V 33/0092; F28D 15/00; F28D 1/0246; F28D 2021/0029; F28D 21/00; F28D 7/16

See application file for complete search history.

(56) References Cited

U.S. PATENT DOCUMENTS

| | | | | |
|---|---|---|---|---|
| 7,972,124 B2 * | 7/2011 | Hirata | ................. | F04B 39/1093 417/413.2 |
| 8,081,454 B2 * | 12/2011 | Ishikawa | ................... | F04F 7/00 165/122 |
| 2004/0196999 A1 * | 10/2004 | Han | ..................... | H04R 1/2819 381/345 |
| 2007/0103868 A1 * | 5/2007 | Yazawa | ................... | H01L 23/34 361/699 |
| 2007/0285890 A1 * | 12/2007 | Tsao | ...................... | H01L 23/467 361/697 |
| 2009/0245563 A1 * | 10/2009 | Parker | ..................... | H04R 1/02 381/345 |
| 2011/0002102 A1 * | 1/2011 | Brok | ..................... | H01L 23/467 361/701 |
| 2012/0085949 A1 * | 4/2012 | Chen | .................... | F04B 43/043 251/129.01 |
| 2013/0058818 A1 * | 3/2013 | Hirata | .................. | F04B 43/046 417/479 |
| 2013/0178752 A1 * | 7/2013 | Kodama | .............. | A61B 5/0235 600/498 |
| 2014/0377099 A1 * | 12/2014 | Hsueh | ................... | F04B 43/046 417/413.2 |
| 2016/0025429 A1 * | 1/2016 | Muir | ..................... | F04B 45/047 165/120 |
| 2016/0076530 A1 * | 3/2016 | Chen | ..................... | F04B 45/047 417/413.2 |
| 2016/0353186 A1 * | 12/2016 | Rothkopf | ............... | H04R 1/028 |
| 2017/0222121 A1 * | 8/2017 | Chen | .................... | F16K 99/0015 |
| 2017/0222123 A1 * | 8/2017 | Chen | ........................ | H01L 41/09 |
| 2017/0222125 A1 * | 8/2017 | Chen | .................... | F04B 45/047 |

FOREIGN PATENT DOCUMENTS

| | | |
|---|---|---|
| CN | 205538890 U | 8/2016 |
| JP | 7-45581 A | 2/1995 |
| JP | 2001-274306 A | 10/2001 |
| JP | 2005-229034 A | 8/2005 |
| JP | 2012-124246 A | 6/2012 |
| JP | 2013-53611 A | 3/2013 |
| JP | 2013-100746 A | 5/2013 |
| JP | 2014-240662 A | 12/2014 |
| TW | 200535596 A | 11/2005 |
| TW | 200802757 A | 1/2008 |
| WO | WO 2016/175185 A1 | 11/2016 |

OTHER PUBLICATIONS

English Translation CN205383064U (Year: 2019).*
English Translation CN205538890U (Year:2019).*
English Translation CN206251549U (Year:2019).*
English Translation JP07045581A (Year: 2019).*
English Translation JP2005229034A (Year: 2019).*
English Translation JP2012124246A (Year: 2019).*
English Translation JP2013053611A (Year: 2019).*
English Translation JP2013100746A (Year: 2019).*
English Translation WO2016175185A (Year: 2019).*
Extended European Search Report for Application No. 17203375.5, dated Apr. 26, 2018.

* cited by examiner

AIR-COOLING HEAT DISSIPATION DEVICE

CROSS-REFERENCE TO RELATED APPLICATION

This application is a continuation-in-part application of U.S. application Ser. No. 15/821,075 filed on Nov. 22, 2017, and claims the priority to Taiwan Patent Application No. 106105649 filed on Feb. 20, 2017, the entirety of which is hereby incorporated by reference.

FIELD OF THE INVENTION

The present invention relates to an air-cooling heat dissipation device, and more particularly to an air-cooling heat dissipation device using an air pump to provide an air flow to remove heat.

BACKGROUND OF THE INVENTION

With increasing development of science and technology, the trends of designing electronic devices such as portable computers, tablet computers, industrial computers, portable communication devices or video players are designed toward minimization, easy portability and high performance. Generally, the limited space inside the electronic device is equipped with various high-integration or high-power electronic components for increasing the computing speed and the function of the electronic device, thus generating a great deal of heat during operations. Consequently, the temperature inside the device is increased and high temperature is harmful to the components. Since the electronic device is usually designed as possible as in slim, flat and succinct appearance, it has insufficient inner space for dissipating the waste heat. In case that the heat is not effectively dissipated away, the electronic components of the electronic device are adversely affected by the heat and the high temperature may result in the interference of operation or damaged of the device.

Generally, there are two types of the heat-dissipating mechanisms used in the electronic device to solve such problem, which are known as active heat-dissipating mechanism and passive heat-dissipating mechanism. The active heat-dissipating mechanism is usually presented as an axial fan or a blower, disposed within the electronic device, which can generate an air flow through the space inside the electronic device that dissipating the waste heat. However, the axial fan and the blower are noisy during operation. In addition, they are bulky and have short life span and not suitable to be used in the small-sized, portable electronic device.

On the other hand, electronic components are generally fixed on a printed circuit board (PCB) by means of surface mount technology (SMT) or selective soldering technology. The electronic components would readily come off from the PCB board due to exposure of high temperature. Moreover, most electronic components would be damaged by high temperature. In other words, high temperature not only impairs the stability of performance of the electronic components, but also shortens the life span of the electronic components.

Figure 1:
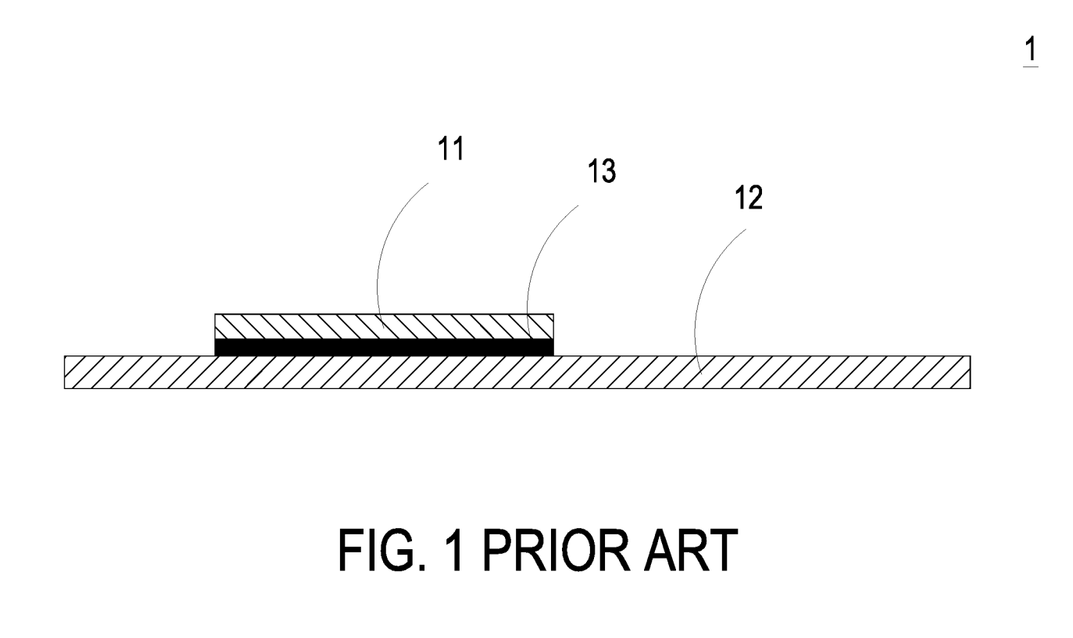
FIG. 1 is a schematic view illustrating a conventional heat-dissipating mechanism.

FIG. 1 is a schematic view illustrating a conventional heat-dissipating mechanism as the passive heat-dissipating mechanism. As shown in FIG. 1, the conventional heat-dissipating mechanism 1 provides a thermal conduction plate 12 attaching on a surface of an electronic component 11 by thermal adhesive 13. Therefore, the thermal adhesive 13 and the thermal conduction plate 12 form a thermal conduction path by which the waste heat generated by the electronic component 11 can be conducted away and then dissipated by convection. However, the heat dissipating efficiency of the conventional heat-dissipating mechanism 1 is usually insufficient, and thus the applications of the conventional heat-dissipating mechanism 1 are limited.

Therefore, there is a need of providing an air-cooling heat dissipation device with improved performance as well as compact size to substitute the conventional technologies.

SUMMARY OF THE INVENTION

An object of the present invention provides an air-cooling heat dissipation device. The air-cooling heat dissipation device is applied to an electronic device to remove heat generated by electronic components of the electronic device. The use of the air-cooling heat dissipation device can increase the heat dissipating efficiency and prevent generating unacceptable noise. Consequently, the performance of the electronic components of the electronic device is stabilized and the life spans of the electronic components are extended.

Another object of the present invention provides an air-cooling heat dissipation device with a temperature controlling function. The operations of an air pump are controlled according to the temperature changes of the electronic components of the electronic device. Consequently, the heat dissipating efficiency is enhanced, and the life span of the air pump is extended.

In accordance with an aspect of the present invention, there is provided an air-cooling heat dissipation device for removing heat from an electronic component. The air-cooling heat dissipation device includes a supporting substrate, an air pump and a heat sink. The supporting substrate has a top surface, a bottom surface, an introduction opening and a thermal conduction plate. The thermal conduction plate is located over the top surface of the supporting substrate and aligned with the introduction opening. The electronic component is disposed on the thermal conduction plate. The air pump is a piezoelectric air pump, fixed on the bottom surface of the supporting substrate, and aligned with and sealing the introduction opening. The air pump comprises a resonance plate, a piezoelectric actuator and a covering member. The resonance plate has a central aperture. The piezoelectric actuator is aligned with the resonance plate. The covering member has a sidewall, a bottom plate and an opening. The sidewall is protruding from the edge of the bottom plate. An accommodation space is defined by the bottom plate and the sidewall collaboratively. The resonance plate and the piezoelectric actuator are disposed within the accommodation space. The opening is formed on the sidewall. A first chamber is formed between the resonance plate and the bottom plate of covering member, and a convergence chamber is defined by the resonance plate and the sidewall of the covering member collaboratively. The heat sink is attached on the electronic component. When the piezoelectric actuator is enabled to perform a gas-collection operation, a gas is introduced into the air pump through the opening of the covering member and converged to the convergence chamber, and then the gas is transferred to and temporarily stored in the first chamber through the central aperture of the resonance plate. When the piezoelectric actuator is enabled to perform a gas-releasing operation, the gas flows from the first chamber to the convergence chamber through the central aperture of the resonance plate and then the gas flows into the discharge opening to perform a heat exchange with the thermal conduction plate.

The above contents of the present invention will become more readily apparent to those ordinarily skilled in the art after reviewing the following detailed description and accompanying drawings, in which:

DETAILED DESCRIPTION OF THE PREFERRED EMBODIMENT

The present invention will now be described more specifically with reference to the following embodiments. It is to be noted that the following descriptions of preferred embodiments of this invention are presented herein for purpose of illustration and description only. It is not intended to be exhaustive or to be limited to the precise form disclosed.

Figure 2A:
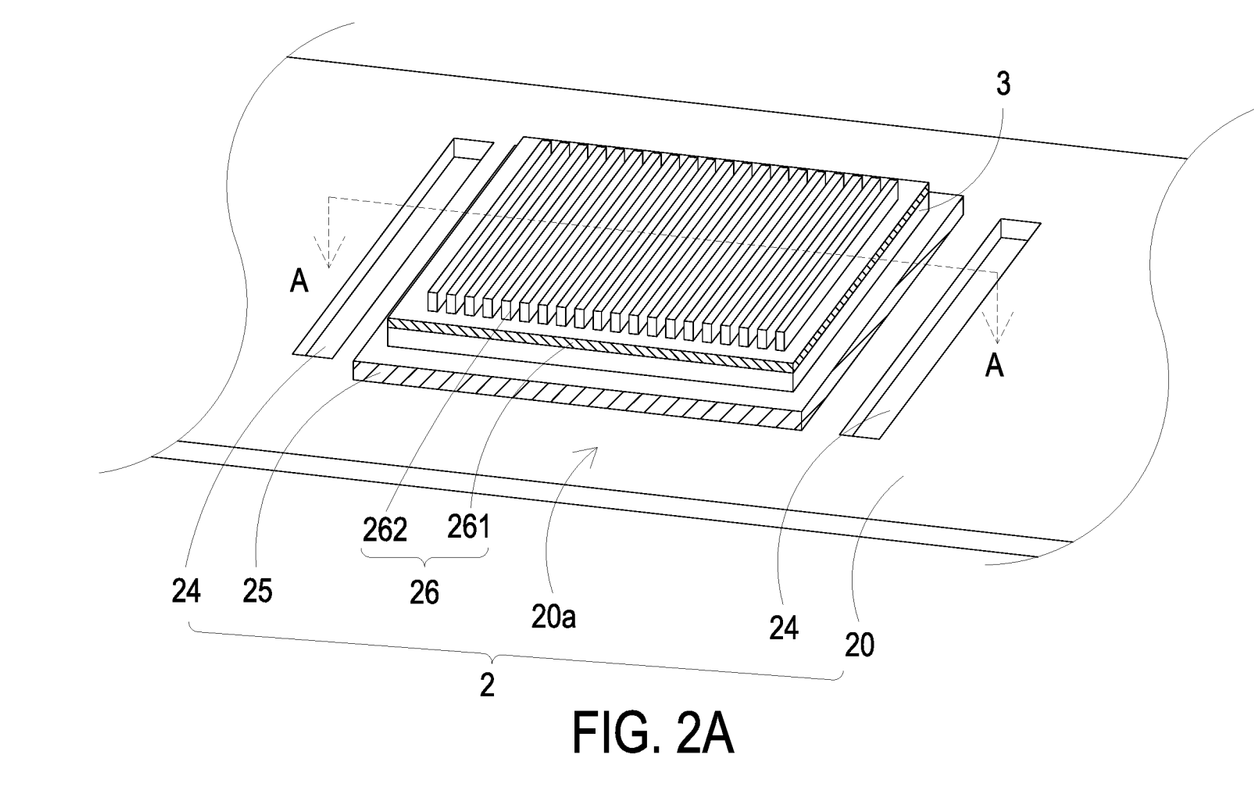
FIG. 2A is a schematic perspective view illustrating the structure of an air-cooling heat dissipation device according to a first embodiment of the present invention.
Figure 2B:
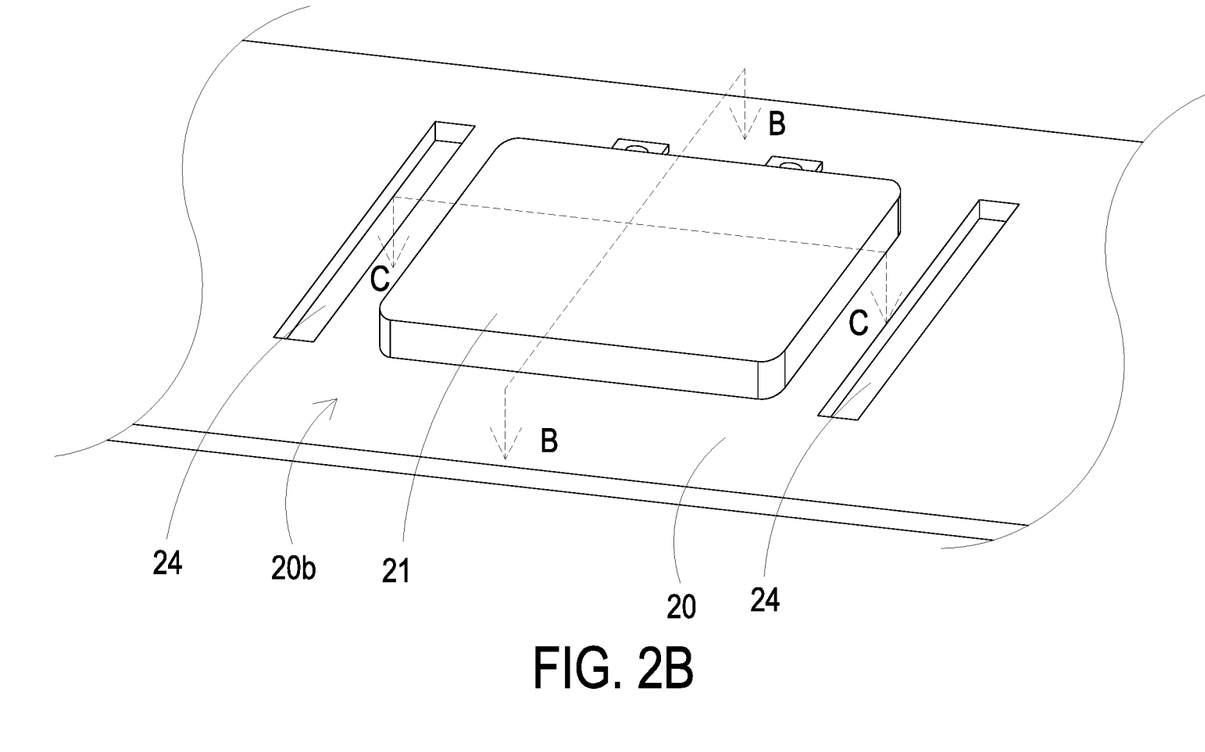
FIG. 2B is a schematic perspective view illustrating the structure of an air-cooling heat dissipation device of FIG. 2A and taken along another viewpoint.
Figure 3:
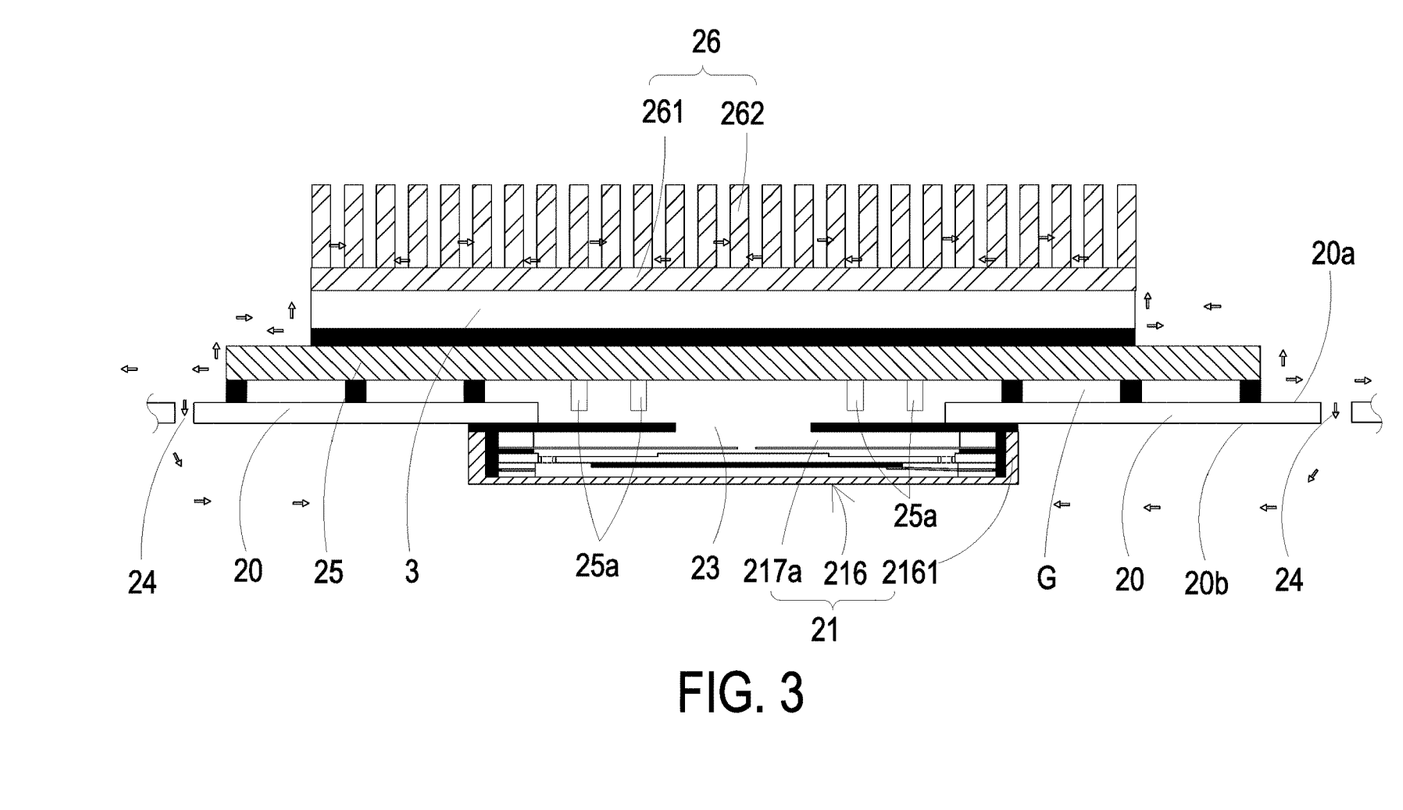
FIG. 3 is a schematic cross-sectional view illustrating the air-cooling heat dissipation device of FIG. 2A and taken along the line AA.

Please refer to FIGS. 2A, 2B and 3. FIG. 2A is a schematic perspective view illustrating the structure of an air-cooling heat dissipation device according to a first embodiment of the present invention. FIG. 2B is a schematic perspective view illustrating the structure of an air-cooling heat dissipation device of FIG. 2A and taken along another viewpoint. FIG. 3 is a schematic cross-sectional view illustrating the air-cooling heat dissipation device of FIG. 2A and taken along the line AA.

The air-cooling heat dissipation device 2 comprises a supporting substrate 20, an air pump 21 and a heat sink 26. The supporting substrate 20 has a top surface 20a, a bottom surface 20b, an introduction opening 23 and a thermal conductive plate 25. The supporting substrate 20 is preferably but not limited to a printed circuit board for the electronic component 3 and the air pump 21 being mounted thereon. The introduction opening 23 runs through the top surface 20a and the bottom surface 20b. The air pump 21 is fixed on the bottom side of the supporting substrate 20 by its periphery mounted on the bottom surface 20b of the supporting substrate 20. In the meantime, the air pump 21 is assembled as being aligned with the introduction opening 23 so as to seal the introduction opening 23. The thermal conduction plate 25 is located over the top surface 20a of the supporting substrate 20, and is aligned with the introduction opening 23. Moreover, there is a gap G between the thermal conduction plate 25 and the supporting substrate 20 for allowing the gas to pass through. In this embodiment, the thermal conduction plate 25 further comprises plural fins 25a disposed on one surface thereof and adjacent to the introduction opening 23, so as to expand the heat dissipating surface area.

The electronic component 3 has a first surface and an opposing second surface, and the electronic component 3 is installed on top of the thermal conduction plate 25 by its first surface. Since the first surface of the electronic component 3 is in contact with the thermal conduction plate 25, a thermal conduction path through the thermal conduction plate 25 is provided, by which the heat generated by the electronic component 3 can be transferred away. The heat sink 26 is disposed on the second surface of the electronic component 3. When the air pump 21 is enabled, the ambient air is introduced into the introduction opening 23 to exchange heat with the thermal conduction plate 25 so as to achieve heat dissipation of the electronic component 3.

In this embodiment, the heat sink 26 is composed of a base 261 and plural fins 262, wherein the base 261 is attaching on the second surface of the electronic component 3, and the fins 262 are mounted on the base 261 perpendicularly. The heat sink 26 expands the heat dissipating surface area, and the heat generated by the electronic component 3 is transferred through the thermal conduction plate 25 to the heat sink 26.

In this embodiment, the air pump 21 is a piezoelectric air pump. The air pump 21 is operable to drive the ambient gas outside the air-cooling heat dissipation device 2 to be introduced into the introduction opening 23. In some embodiments, the supporting substrate 20 further comprises at least one circulating groove 24, which runs through the top surface 20a and the bottom surface 20b of the supporting substrate 20. The circulating groove 24 is adjacent to the periphery of the thermal conduction plate 25. When the ambient gas is driven by the air pump 21 and is introduced into the introduction opening 23, the introduced gas exchanges heat with the thermal conduction plate 25, which is located over the top surface 20a of the supporting substrate 20. Meanwhile, the introduced gas pushes the initial gas which has filled the gap G to flow quickly, which facilities discharge of the heated gas from the gap G A part of the discharged gas goes through the circulating groove 24 and flows to the bottom surface 20b of the supporting substrate 20. After being cooled down, it may be driven by the air pump 21 again. Meanwhile, another part of the discharged air goes along the periphery of the thermal conduction plate 25 to the fins 261 of the heat sink 26, the temperature of which usually has been dropped when arriving the fins 261, thus speeding up the process of heat dissipation of the electronic component 3. Since the air pump 21 continuously inputs the gas under operation, the electronic component 3 keeps exchanging heat with the input gas, and the gas is discharged after heat exchange. Hence, the heat dissipation of the electronic component 3 is achieved. Because the heat dissipating efficiency is enhanced, the performance of the electronic component 3 is stabilized and the life span of the electronic component 3 is extended.

Figure 4A:
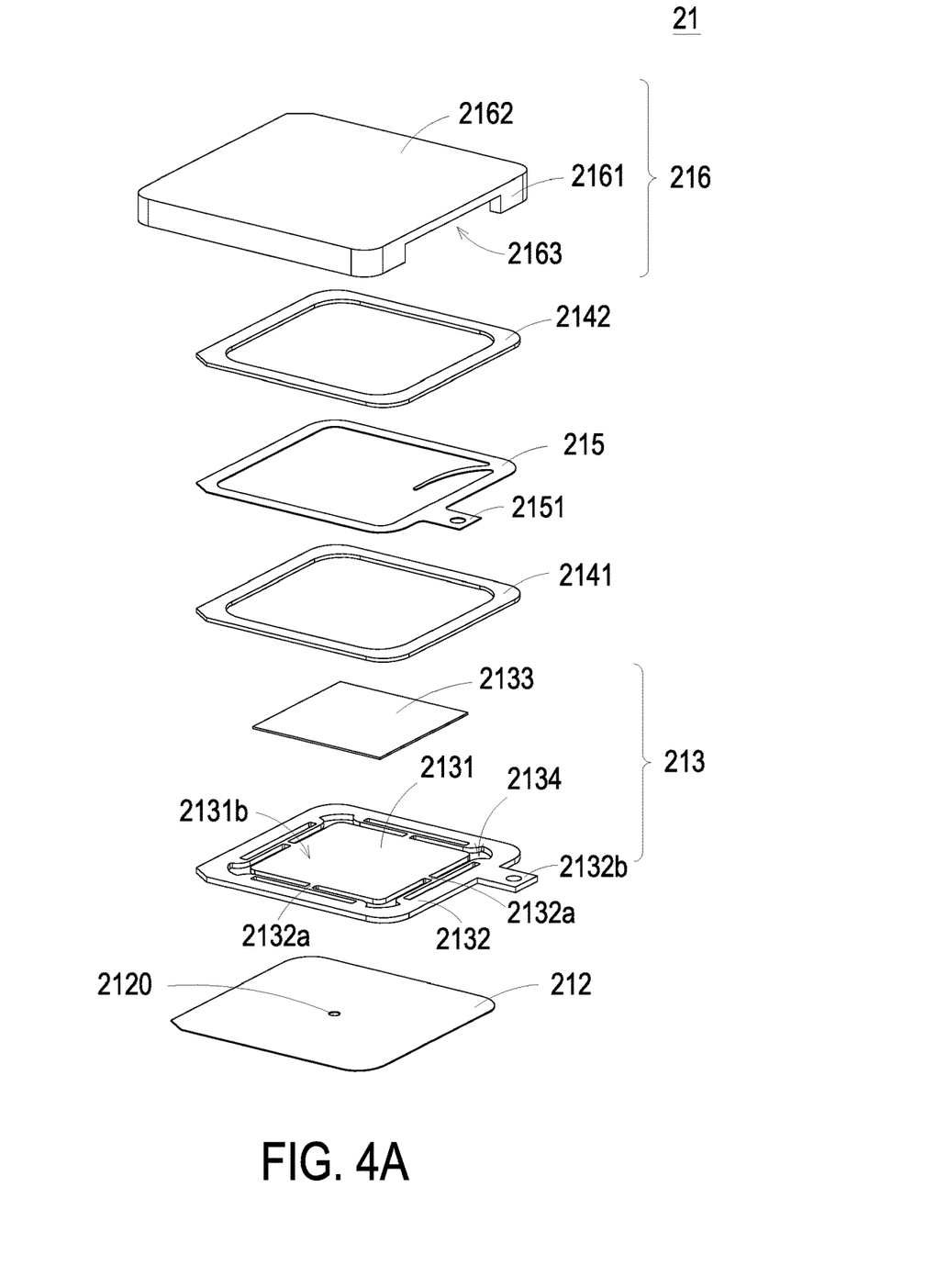
FIG. 4A is a schematic exploded view illustrating an air pump used in the air-cooling heat dissipation device of the present invention.
Figure 4B:
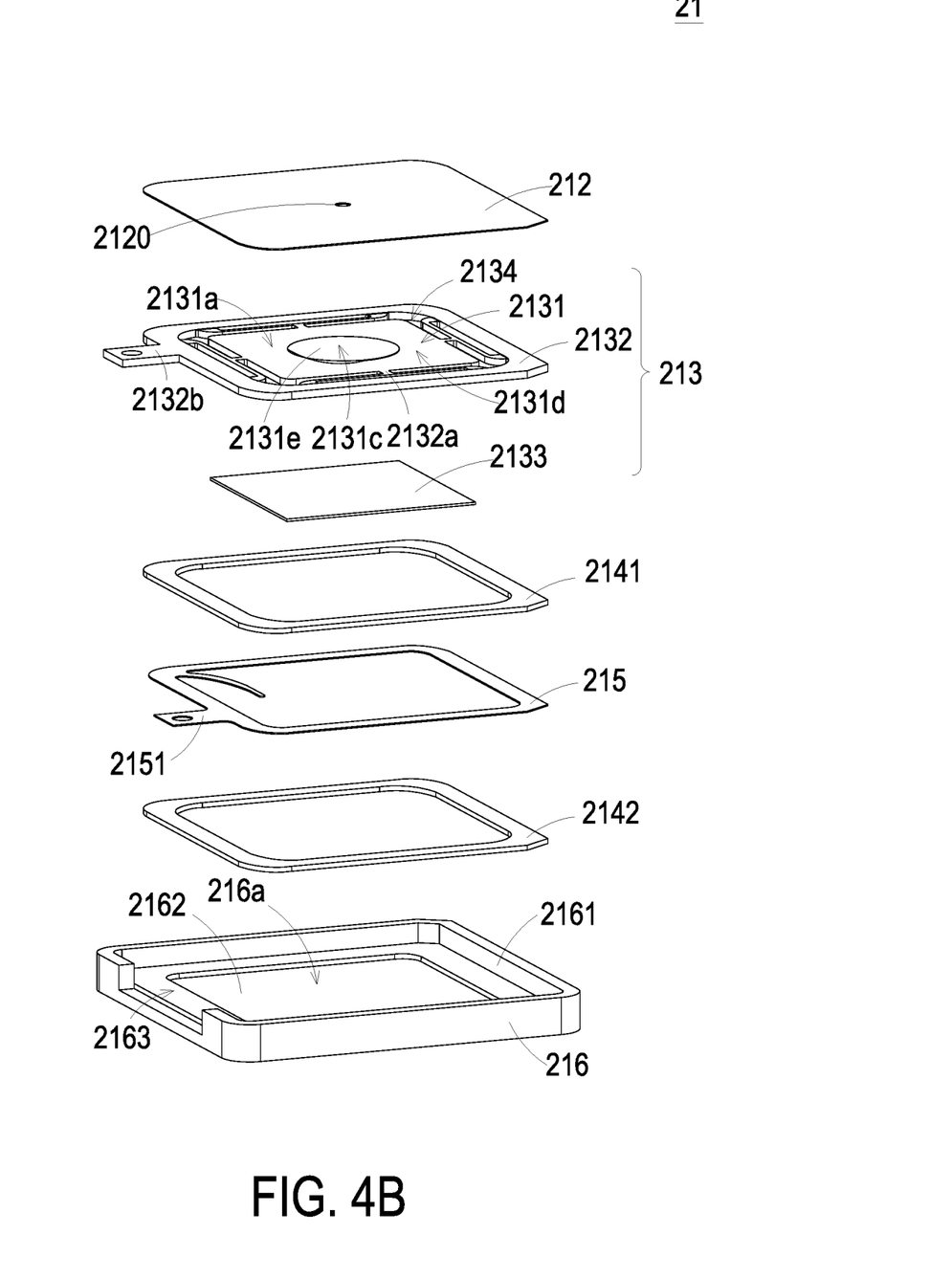
FIG. 4B is a schematic exploded view illustrating the air pump of FIG. 4A and taken along another viewpoint.

FIG. 4A is a schematic exploded view illustrating an air pump used in the air-cooling heat dissipation device of the present invention and taken along the front side. FIG. 4B is a schematic exploded view illustrating the air pump of FIG. 4A and taken along the rear side. In this embodiment, the air pump 21 is a piezoelectric air pump for driving gas to flow. As shown, the air pump 21 comprises a resonance plate 212, a piezoelectric actuator 213 and a covering member 216. The resonance plate 212 is aligned with the piezoelectric actuator 213 and comprises a central aperture 2120 disposed in a middle area thereof, but not limited thereto. The piezoelectric actuator 213 comprises a suspension plate 2131, an outer frame 2132 and a piezoelectric ceramic plate 2133. The suspension plate 2131 comprises a middle portion 2131c and a periphery portion 2131d. When the piezoelectric ceramic plate 2133 is subjected to the curvy vibration in response to an applied voltage, the suspension plate 2131 is subjected to the curvy vibration from the middle portion 2131c to the periphery portion 2131d. The outer frame 2132 is arranged around the suspension plate 2131, including but not limited to at least one bracket 2132a and a conducting pin 2132b. Each of the at least one bracket 2132a is arranged between the suspension plate 2131 and the outer frame 2132. The two ends of the bracket 2132a are connected to the suspension plate 2131 and the outer frame 2132, respectively. Consequently, the bracket 2132a can elastically support the suspension plate 2131. The conducting pin 2132b is protruding outwardly from the outer frame 2132 so as to be electrically connected with an external power source (not shown). The piezoelectric ceramic plate 2133 is attached on a second surface 2131b of the suspension plate 2131. When the piezoelectric ceramic plate 2133 is subjected to deformation in response to an applied voltage, the suspension plate 2131 is subjected to a curvy vibration.

The covering member 216 comprises a sidewall 2161, a bottom plate 2162 and an opening 2163. The sidewall 2161 is protruded from the edges of the bottom plate 2162. Moreover, an accommodation space 216a is defined by the sidewall 2161 and the bottom plate 2162 collaboratively. The resonance plate 212 and the piezoelectric actuator 213 are accommodated within the accommodation space 216a. The opening 2163 is formed in the sidewall 2161. The conducting pin 2132b of the outer frame 2132 and the conducting pin 2151 of the conductive plate 215 are protruding out of the covering member 216 through the opening 2163 so as to be electrically connected with an external circuit (not shown), but not limited herein.

The air pump 21 further comprises a first insulation plate 2141, a conducting plate 215 and a second insulation plate 2142. The first insulation plate 2141 is located over the conducting plate 215. The second insulation plate 2142 is located under the conducting plate 215. The shapes of the first insulation plate 2141 and the second insulation plate 2142 substantially match the shape of the outer frame 2132 of the piezoelectric actuator 213. The first insulation plate 2141 and the second insulation plate 2142 are made of an insulating material (e.g. a plastic material) for providing insulating efficacy. The conducting plate 215 is made of an electrically conductive material (e.g. a metallic material) for providing electrically conducting efficacy. The shape of the conducting plate 215 substantially matches the shape of the outer frame 2132 of the piezoelectric actuator 213. Moreover, the conducting plate 215 has the conducting pin 2151.

Figure 5A:
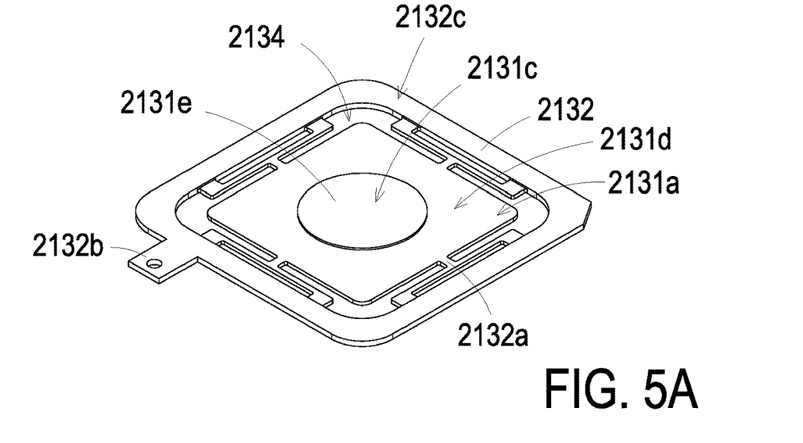
FIG. 5A is a schematic perspective view illustrating the piezoelectric actuator of the air pump as shown in FIGS. 4A and 4B and taken along the front side.
Figure 5B:
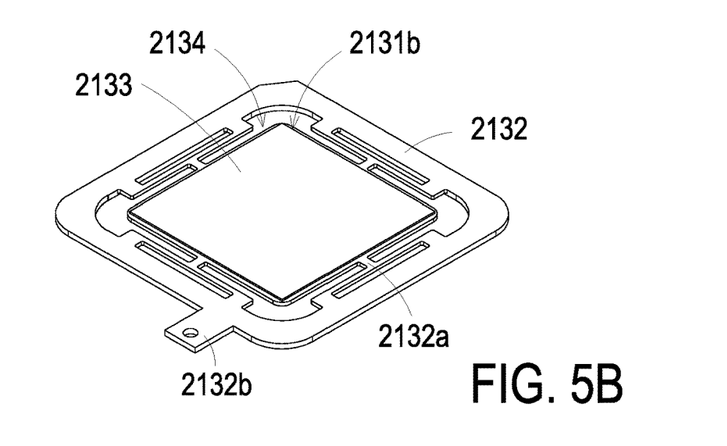
FIG. 5B is a schematic perspective view illustrating the piezoelectric actuator of the air pump as shown in FIGS. 4A and 4B and taken along the rear side.
Figure 5C:
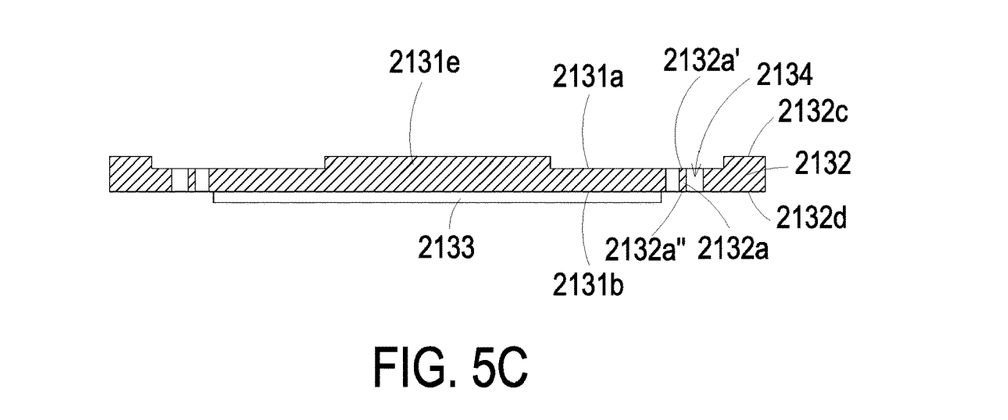
FIG. 5C is a schematic cross-sectional view illustrating the piezoelectric actuator of the air pump as shown in FIGS. 4A and 4B.

Please refer to FIGS. 5A, 5B and 5C. FIG. 5A is a schematic perspective view illustrating the piezoelectric actuator of the air pump as shown in FIGS. 4A and 4B and taken along the front side. FIG. 5B is a schematic perspective view illustrating the piezoelectric actuator of the air pump as shown in FIGS. 4A and 4B and taken along the rear side. FIG. 5C is a schematic cross-sectional view illustrating the piezoelectric actuator of the air pump as shown in FIGS. 4A and 4B. In this embodiment, the suspension plate 2131 is a stepped structure. That is, the suspension plate 2131 comprises a bulge 2131e. The bulge 2131e is formed on the first surface 2131a of the suspension plate 2131 and located at the middle portion 2131c. For example, the bulge 2131e is a circular convex structure, but not limited thereto. In some embodiments, the suspension plate 2131 is a square plate structure with two flat surfaces.

Please refer to FIG. 5C again. A top surface of the bulge 2131e of the suspension plate 2131 is coplanar with a first surface 2132c of the outer frame 2132, and the first surface 2131a of the suspension plate 2131 is coplanar with a first surface 2132a' of the bracket 2132a. Moreover, the bulge 2131e of the suspension plate 2131 (or the first surface 2132c of the outer frame 2132) has a specified thickness with respect to the first surface 2131a of the suspension plate 2131 (or the first surface 2132a' of the bracket 2132a). A second surface 2131b of the suspension plate 2131, a second surface 2132d of the outer frame 2132 and a second surface 2132a" of the bracket 2132a are coplanar with each other. The piezoelectric ceramic plate 2133 is attached on the second surface 2131b of the suspension plate 2131. In some other embodiments, the suspension plate 2131 is a square plate structure with two flat surfaces. That is, the structure of the suspension plate 2131 may be varied according to the practical requirements. In this embodiment, the suspension plate 2131, the outer frame 2132 and the at least bracket 2132a are integrally formed and produced by using a metal plate (e.g., a stainless steel plate). Moreover, at least one vacant space 2134 is formed between the suspension plate 2131, the outer frame 2132 and the bracket 2132a for allowing the gas to go through.

Figure 6:
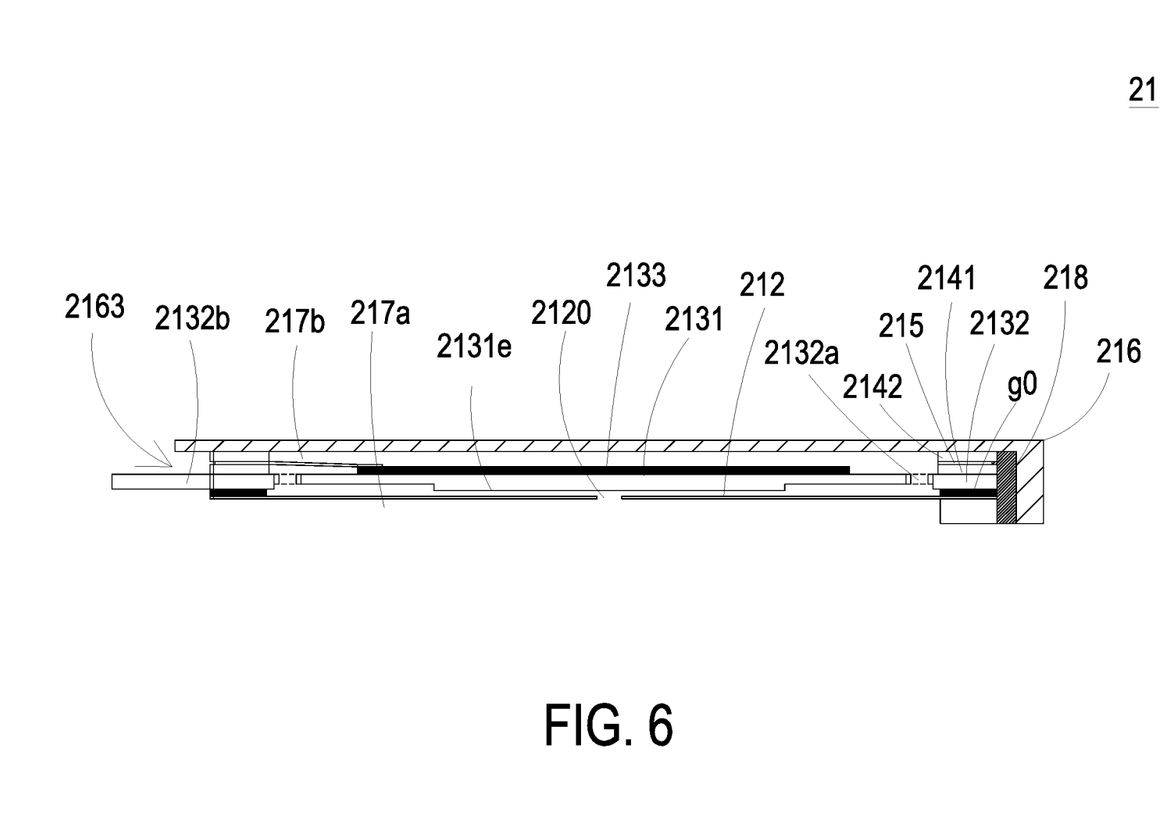
FIG. 6 is a schematic cross-sectional view illustrating the air-cooling heat dissipation device of FIG. 2B and taken along the line BB.
Figure 7A:
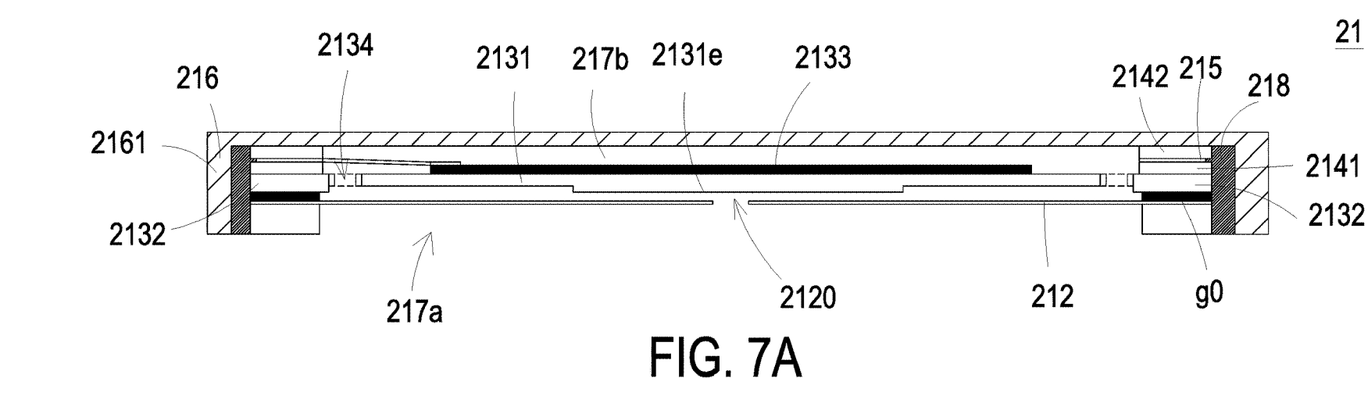
FIG. 7A is a schematic cross-sectional view illustrating the air-cooling heat dissipation device of FIG. 2B and taken along the line CC.

The structure of the assembled air pump 21 is described below. FIG. 6 is a schematic cross-sectional view illustrating the air-cooling heat dissipation device of FIG. 2B and taken along the line BB. FIG. 7A is a schematic cross-sectional view illustrating the air-cooling heat dissipation device of FIG. 2B and taken along the line CC. As shown in FIGS. 6 and 7A, from top to bottom, the covering member 216, the second insulation plate 2142, the conducting plate 215, the first insulation plate 2141, the piezoelectric actuator 213 and the resonance plate 212 of the air pump 21 are stacked on each other sequentially, wherein the peripheries of the piezoelectric actuator 213, the first insulation plate 2141, the conducting plate 215 and the second insulation plate 2142 are coated with glue to form a glue layer 218. The glue layer 218 is filled in the accommodation space 216a of the covering member 216 and seal the peripheries of the components. Consequently, the air pump 21 is assembled. Preferably but not exclusively, the air pump 21 has a cubic structure, while the profile of the air pump 21 can be varied according to the practical requirement. The conducting pin 2132b of the outer frame 2132 and the conducting pin 2151 of the conductive plate 215 are protruding out of the covering member 216 through the opening 2163 so as to be electrically connected with an external power source (not shown). The first chamber 217b is formed between the resonance plate 212 and the covering member 216.

As shown in FIG. 3, after the air pump 21 and the supporting substrate 20 are assembled together, the sidewall 2161 of the covering member 216 abuts the bottom surface 20b of the supporting substrate 20 and the air pump 21 seals the introduction opening 23. A convergence chamber 217a is defined by the resonance plate 212 and the sidewall 2161 of the covering member 216 collaboratively. As shown in FIG. 6, the air pump 21 is in communication with the surroundings through the opening 2163 of the covering member 216 so as to collect air from the surroundings. In this embodiment, there is a gap g0 between the resonance plate 212 and the piezoelectric actuator 213 of the air pump 21. An electrically conductive material, for example but not limited to a conductive adhesive, is filled in the gap g0. The gap g0 ensures the proper distance between the bulge 2131e of the suspension plate 2131 of the piezoelectric actuator 213 and the resonance plate 212, so that the gas can flow faster, the contact interference is reduced and the generated noise is largely reduced. In some embodiments, the height of the outer frame 2132 of the piezoelectric actuator 213 is increased for forming and maintaining the gap between the resonance plate 212 and the piezoelectric actuator 213. When the piezoelectric actuator 213 is enabled to perform a gas-collection operation, a gas is introduced into the air pump 21 through the opening 2163 of the covering member 216 and converged to the convergence chamber 217a, and then the gas is transferred to the first chamber 217b through the central aperture 2120 of the resonance plate 212 and temporarily stored therein. When the piezoelectric actuator 213 is enabled to perform a gas-releasing operation, the gas flows from the first chamber 217b to the convergence chamber 217a through the central aperture 2120 of the resonance plate 212 and then the gas is introduced into the introduction opening 23 to exchange heat with the thermal conduction plate 25 so as to remove heat from the electronic component 3.

Figure 7B:
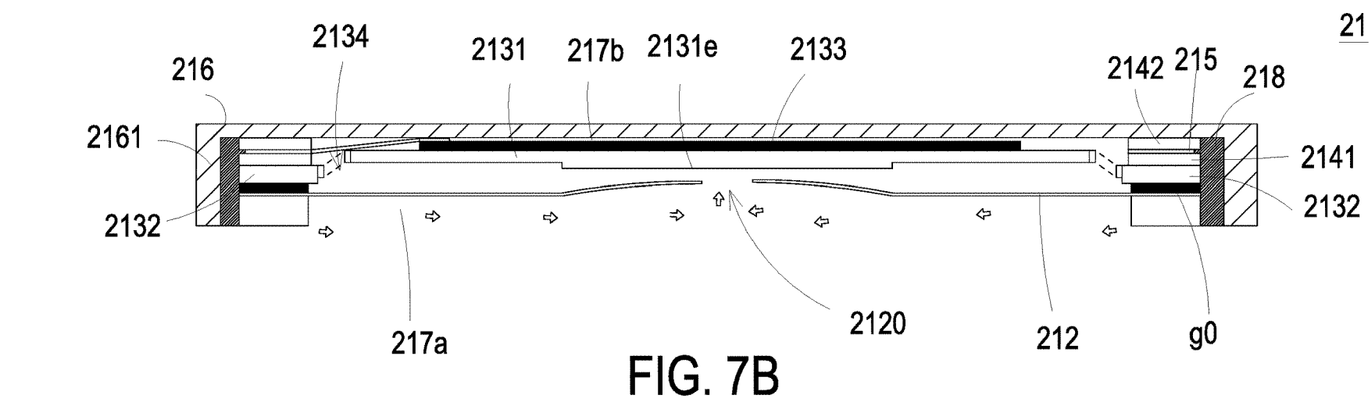
FIGS. 7B to 7D schematically illustrate the actions of the air pump of FIGS. 4A and 4B.
Figure 7C:
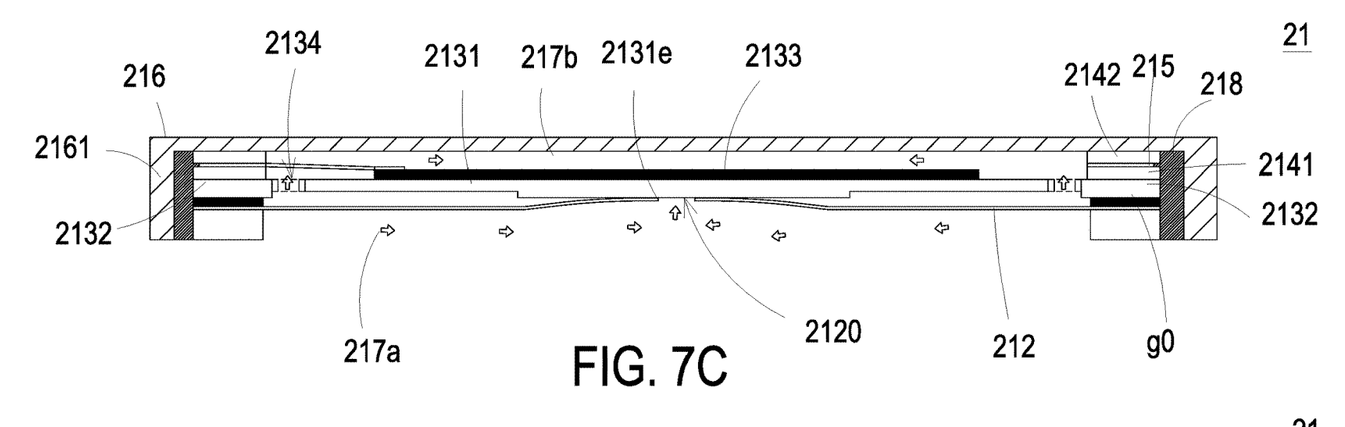
Figure 7D:
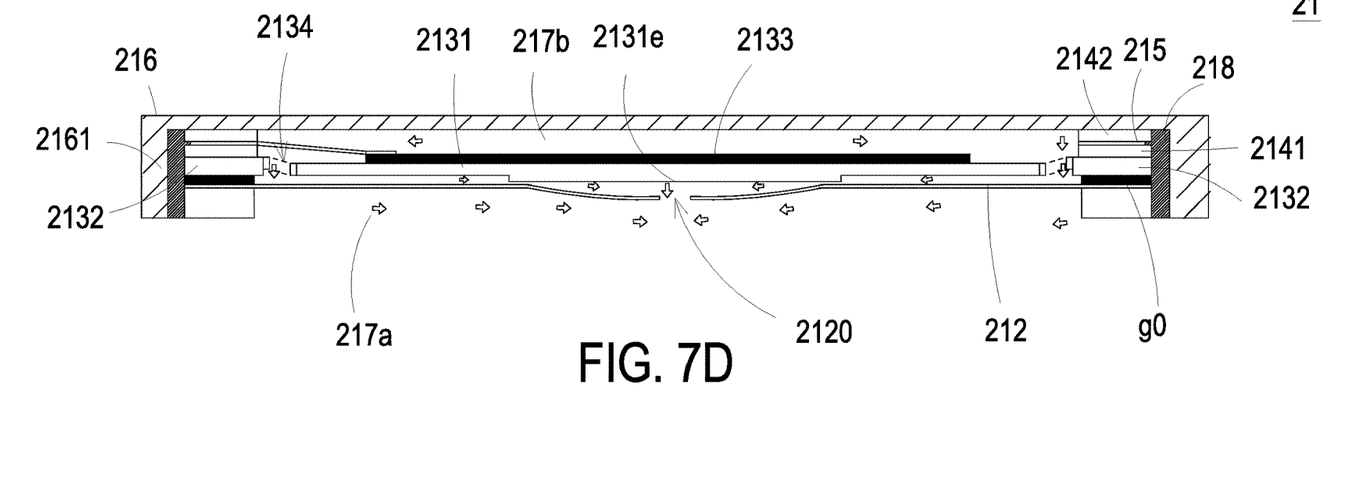

The operations of the air pump 21 will be described as follows. FIGS. 7B to 7D schematically illustrate the actions of the air pump according to the embodiment of the present invention. Please refer to FIG. 7A, which shows an initial state of the air pump 21 not in action. After the covering member 216, the second insulation plate 2142, the conducting plate 215, the first insulation plate 2141, the piezoelectric actuator 213 and the resonance plate 212 of the air pump 21 are stacked on each other sequentially, the air pump 21 is assembled. There is a gap g0 between the resonance plate 212 and the piezoelectric actuator 213. The convergence chamber 217a is defined by the resonance plate 212 and the sidewall 2161 of the covering member 216 collaboratively. The first chamber 217b is formed between the resonance plate 212 and the piezoelectric actuator 213.

Please refer to FIG. 7B. When the piezoelectric actuator 213 of the air pump 21 is actuated, the piezoelectric actuator 213 is vibrated upwardly in response to the applied voltage. Consequently, the ambient gas is introduced into the air pump 21 through the opening 2163 of the covering member 216. After the gas is converged to the convergence chamber 217a, the gas is transferred to the first chamber 217b through the central aperture 2120 of the resonance plate 212. Due to the resonance effect of the suspension plate 2131 of the piezoelectric actuator 213, the resonance plate 212 is vibrated in a reciprocating manner. That is, the resonance plate 212 is subjected to an upward deformation. As shown, the portion of the resonance plate 212 around the central aperture 2120 is protruding upwardly.

Please refer to FIG. 7C. The piezoelectric actuator 213 is vibrating downwardly and has returned to its original position. Meanwhile, the bulge 2131e of the suspension plate 2131 of the piezoelectric actuator 213 is moving towards the resonance plate 212. Consequently, the gas in the lower portion of the first chamber 217b is pushed toward peripheral regions of the first chamber 217b. Then, the gas is transferred upwardly through the vacant space 2134 of the piezoelectric actuator 213. Consequently, the gas in the air pump 21 is transferred to the upper portion of the first chamber 217b and temporarily stored therein.

Please refer to FIG. 7D. The piezoelectric actuator 213 is further vibrating downwardly. Due to the resonance effect of the piezoelectric actuator 213, the resonance plate 212 is also vibrating downwardly. Due to the downward deformation of the resonance plate 212, the volume of the first chamber 217b is shrunken and a pressure gradient is generated therein. Consequently, the gas in the upper portion of the first chamber 217b is pushed toward peripheral regions of the first chamber 217b. Then, the gas is transferred downwardly through the vacant space 2134 of the piezoelectric actuator 213, blowing out under pressure through the central aperture 2120 of the resonance plate 212 to form a compressed air flow, which flows towards the introduction opening 23 of the supporting substrate 20 and exchange heat with the thermal conduction plate 25. From the above discussions, when the resonance plate 212 is vibrating along the vertical direction in the reciprocating manner, the gap g0 between the resonance plate 212 and the piezoelectric actuator 213 is helpful to increase the amplitude of the resonance plate 212. That is, the proper gap g0 between the resonance plate 212 and the piezoelectric actuator 213 allows maximum amplitude of vibration of the resonance plate 212.

Finally, the resonance plate 212 is returned to its original position, as shown in FIG. 7A. The processes of FIGS. 7A to 7D are repeatedly done. Consequently, the gas is continuously introduced into the convergence chamber 217a through the opening 2163 of the covering member 216, and transferred to the first chamber 217b. Then, the gas is transferred from the first chamber 217b to the convergence chamber 217a, and continuously fed into the introduction opening 23. Consequently, the gas can be transferred in a steady way. When the air pump 21 is operating, the gas is sequentially transferred through the opening 2163 of the covering member 216, the convergence chamber 217a, the first chamber 217b, the convergence chamber 217a and the introduction opening 23. By utilizing the single covering member 216 of the air pump 21 and utilizing the opening 2163 of the covering member 216, the components of the air pump 21 can be reduced and the assembling process can be simplified.

As mentioned above, the operation of the air pump 21 guides the gas into the introduction opening 23 of the supporting substrate 20 which forms a flow of the gas. The flow of the gas flows into the gap G and exchanges heat with the thermal conduction plate 25, which is connected to the electronic component 3. Meanwhile, the flow of the gas continuously pushes the gas in the gap G, facilitating discharge of the heated gas out of the gap G. Consequently, the heat dissipating efficiency is enhanced. Under this circumstance, the performance stability and the use spin of the electronic component 3 is increased. Moreover, due to the discharge of the heated gas out of the gap G, the gas convention around the heat sink 26 is indirectly enhanced. Consequently, the heat dissipating efficiency is further enhanced.

Figure 8:
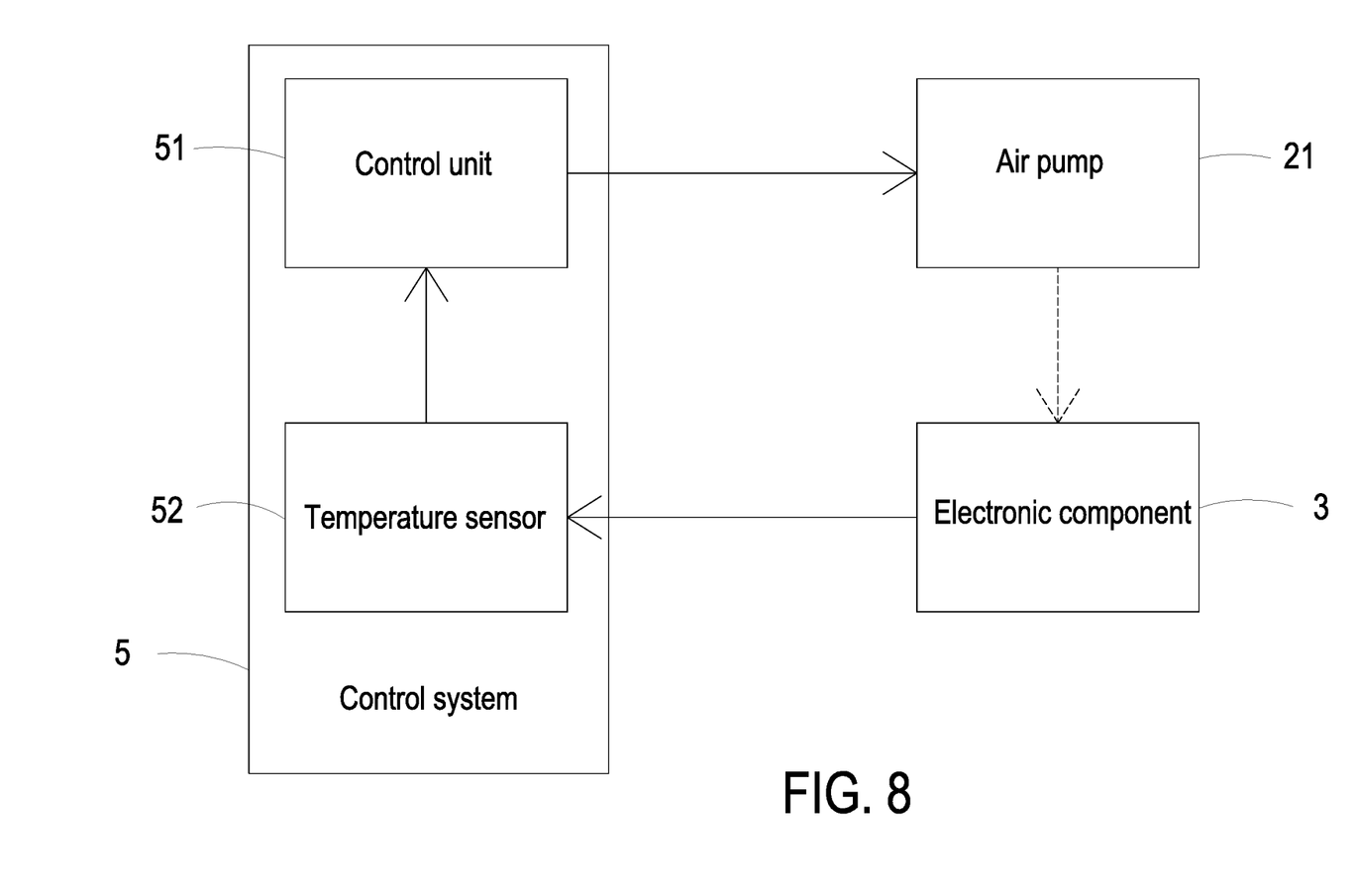
FIG. 8 is a schematic cross-sectional view illustrating an air-cooling heat dissipation device according to a second embodiment of the present invention.

FIG. 8 is a schematic cross-sectional view illustrating an air-cooling heat dissipation device according to a third embodiment of the present invention. In this embodiment, the air-cooling heat dissipation device 2 further provides a temperature controlling function. The air-cooling heat dissipation device 2 further comprises a control system 5. The control system 5 comprises a control unit 51 and a temperature sensor 52. The control unit 51 is electrically connected with the air pump 21 to control the operation of the air pump 21. In an embodiment, the temperature sensor 52 is located near the electronic component 3 for sensing the temperature near the electronic component 3. Alternatively, the temperature sensor 52 is attached on the electronic component 3 for sensing the temperature of the electronic component 3. The temperature sensor 52 is electrically connected with the control unit 51. After detecting the temperature of the electronic component 3, the temperature sensor 52 accordingly transmits a detecting signal to the control unit 51. According to the detecting signal received from the temperature sensor 52, the control unit 51 determines whether the temperature of the electronic component 3 is higher than or equal to a threshold value. If the control unit 51 judges that the temperature of the electronic component 3 is higher than or equal to the threshold value, the control unit 51 issues an enabling signal to the air pump 21 to enable it. When the air pump 21 is enabled, the gas is driven to cool the electronic component 3. Consequently, the heat of the electronic component 3 is dissipated away and the temperature of the electronic component 3 drops. If the control unit 51 determines that the temperature of the electronic component 3 is lower than the threshold value, the control unit 51 issues a disabling signal to the air pump 21 to disable the air pump 21, so that unnecessary operation of the air pump 21 is prevented, thus prolonging life span of the air pump 21 and saving power consumption. That is, in case that the temperature of the electronic component 3 is too high, the control system 5 controls the air pump 21 to cool the electronic component 3. Oppositely, in case that the temperature of the electronic component 3 has been dropped, the control system 5 disables the air pump 21. Since the electronic component 3 is operating at a suitable temperature, the performance stability of the electronic component 3 is increased.

From the above descriptions, the present invention provides an air-cooling heat dissipation device. The air-cooling heat dissipation device is applied to various electronic devices to remove heat from electronic components of the electronic devices. Consequently, the heat dissipating efficiency is enhanced, the noise is reduced, the performance of the electronic components of the electronic device is stabilized, and the life spans of the electronic components are extended. Moreover, the operations of an air pump are controlled according to the temperature changes of the electronic components of the electronic device. Consequently, the heat dissipating efficiency is enhanced, and the life span of the air pump is extended.

While the invention has been described in terms of what is presently considered to be the most practical and preferred embodiments, it is to be understood that the invention needs not be limited to the disclosed embodiment. On the contrary, it is intended to cover various modifications and similar arrangements included within the spirit and scope of the appended claims which are to be accorded with the broadest interpretation so as to encompass all such modifications and similar structures.

What is claimed is:

1. An air-cooling heat dissipation device for removing heat from an electronic component, the air-cooling heat dissipation device comprising:
a supporting substrate comprising a top surface, a bottom surface, an introduction opening and a thermal conduction plate, wherein the thermal conduction plate is disposed on the top surface of the supporting substrate and aligned with the introduction opening, and the electronic component is disposed on the thermal conduction plate;
an air pump, wherein the air pump is a piezoelectric air pump fixed on the bottom surface of the supporting substrate, and correspondingly sealing the introduction opening, wherein the air pump comprises:
a resonance plate having a central aperture;
a piezoelectric actuator aligned with the resonance plate; and
a covering member having a sidewall, a bottom plate and an opening, wherein the bottom surface of the supporting substrate continuously extends from one side of the sidewall to the other side of the sidewall, and the sidewall is protruding from the edge of the bottom plate to contact the bottom surface of the supporting substrate, wherein an accommodation space is defined by the bottom plate and the sidewall collaboratively, the resonance plate and the piezoelectric actuator are disposed within the accommodation space, and the opening is formed on the sidewall, wherein a first chamber is formed between the resonance plate and the bottom plate of covering member, and a convergence chamber is defined by the resonance plate and the sidewall of the covering member collaboratively; and
a heat sink attached on the electronic component,
wherein when the piezoelectric actuator is enabled to perform a gas-collection operation, a gas is introduced into the air pump through the opening of the covering member and converged to the convergence chamber, and then the gas is transferred to the first chamber through the central aperture of the resonance plate and temporarily stored in the first chamber, wherein when the piezoelectric actuator is enabled to perform a gas-releasing operation, the gas flows from the first chamber through the central aperture of the resonance plate and to the introduction opening, so as to exchange heat with the thermal conduction plate.

2. The air-cooling heat dissipation device according to claim 1, wherein the introduction opening runs through the top surface and the bottom surface of the supporting substrate.

3. The air-cooling heat dissipation device according to claim 1, wherein a gap is formed between the thermal conduction plate and the supporting substrate for allowing the gas to go through.

4. The air-cooling heat dissipation device according to claim 1, wherein the thermal conduction plate is attached on a first surface of the electronic component, and the heat sink is attached on a second surface of the electronic component.

5. The air-cooling heat dissipation device according to claim 1, wherein the supporting substrate further comprises at least one circulating groove running through the top surface and the bottom surface of the supporting substrate, and the at least one circulating groove is adjacent to the periphery of the thermal conduction plate.

6. The air-cooling heat dissipation device according to claim 1, wherein the piezoelectric actuator comprises:
   a suspension plate having a first surface and an opposing second surface;
   an outer frame having at least one bracket arranged between the suspension plate and the outer frame and connected therebetween; and
   a piezoelectric ceramic plate attached on the first surface of the suspension plate driving curvy vibration of the suspension plate when being applied to a voltage.

7. The air-cooling heat dissipation device according to claim 6, wherein a gap is formed between the resonance plate and the piezoelectric actuator.

8. The air-cooling heat dissipation device according to claim 7, wherein the piezoelectric air pump further comprises a conducting plate and at least one insulation plate, wherein the at least one insulation plate and the conducting plate are sequentially disposed beneath the bottom side of the piezoelectric actuator.

9. The air-cooling heat dissipation device according to claim 8, wherein the outer frame of the piezoelectric actuator comprises a first conducting pin, the conducting plate comprises a second conducting pin, and the opening of the covering member is formed on the sidewall of the covering member, wherein the first conducting pin and the second conducting pin are protruding out of the opening of the covering member so as to be electrically connected with an external power source.

10. The air-cooling heat dissipation device according to claim 6, wherein at least one vacant space is formed between the suspension plate, the outer frame and the at least one bracket, and two ends of the bracket are connected to the suspension plate and the outer frame, respectively.

11. The air-cooling heat dissipation device according to claim 6, wherein the suspension plate has a bulge formed on the second surface thereof, and the bulge is a cylinder.

12. The air-cooling heat dissipation device according to claim 1, further comprising a control system, wherein the control system comprises:
   a control unit electrically connected with the air pump for controlling operations of the air pump; and
   a temperature sensor electrically connected with the control unit and located near the electronic component, wherein the temperature sensor detects a temperature of the electronic component and transmits a corresponding detecting signal to the control unit,
   wherein the control unit obtains the temperature of the electronic component according to the detecting signal, wherein if the control unit determines the temperature of the electronic component is higher than or equal to a threshold value, the control unit enables the air pump to drive the air to flow, wherein if the control unit determines the temperature of the electronic component is lower than the threshold value, the control unit disables the air pump.

* * * * *